United States Patent [19]  [11]  4,038,563
Zuleeg et al.  [45]  July 26, 1977

[54] SYMMETRICAL INPUT NOR/NAND GATE CIRCUIT

[75] Inventors: Rainer Zuleeg, Huntington Beach; Johannes K. Notthoff, Lomita, both of Calif.

[73] Assignee: McDonnell Douglas Corporation, Long Beach, Calif.

[21] Appl. No.: 619,308

[22] Filed: Oct. 3, 1975

[51] Int. Cl.² .................. H03K 19/08; H03K 19/34; H03K 19/36; H01L 29/80
[52] U.S. Cl. .................. 307/205; 307/213; 307/215; 307/304; 357/22; 357/41
[58] Field of Search ............... 307/205, 213, 214, 215, 307/304; 357/22, 41

[56] References Cited

U.S. PATENT DOCUMENTS 3,201,574  8/1965  Szekely ........................ 307/205 X
3,325,653  6/1967  Husher et al. ................ 307/213 X Primary Examiner—John S. Heyman
Assistant Examiner—Larry N. Anagnos
Attorney, Agent, or Firm—Donald L. Royer; Walter J. Jason

[57] ABSTRACT

An electrical circuit is shown having first and second pluralities of junction field effect transistors connected with an output transistor to provide NOR/NAND gate logic operation. The junction field effect transistors are preferably enhancement mode junction field effect transistors selected so that the circuit can be constructed as described on an integrated circuit chip.

5 Claims, 5 Drawing Figures

HORIZ. 0.5 V/DIV
VERT. 0.2 mA/DIV
POSITIVE GATE VOLTAGE IN
0.2 V/STEP
$V_T \simeq 0.1V$ $Z_L = 10.5 pF + 1K$
$P_D = 4.8 mW$ (OFF OR ON), GATE ONLY
$P_D = 1.6 mW$ IN LOAD WHEN OUTPUT HIGH
$t_{pd} = 5 ns$ (UP) AND 4ns (DOWN)
$P_D \times t_{pd} = 21.6 pJ$ $Z_L = 10.5 \, pF + 1K$
$P_D = 2.6 \, mW \, (ON), \, 100 \, \mu W \, (OFF)$
$t_{pd} = 3 \, ns$
$P_{D(ON)} \times t_{pd} = 4 \, pJ \, (50\% \, ON\text{-}OFF)$

SYMMETRICAL INPUT NOR/NAND GATE CIRCUIT

BACKGROUND OF THE INVENTION

Our present invention relates generally to field effect transistors and, more particularly, to an enhancement mode or normally-off junction field effect transistor.

Gallium arsenide (GaAs) junction and Schottky barrier field effect transistors (FETs) have demonstrated useful application in microwave amplifier design at frequencies beyond the reach of silicon bipolar and unipolar transistors. The high-speed integrated logic performance of GaAs Schottky barrier field effect transistors, which are operated in the normally-on state, in integrated logic gate design revealed a 60 to 100 picosecond (ps) propagation delay with an average power dissipation of 90 milliwatts (mW), for example.

GaAs enhancement mode (or normally-off) field effect transistor integrated circuits offer better speed-power products than complementary metal oxide semiconductor (CMOS) or Schottky-clamped bipolar ones at operating frequencies of 1 megahertz (MHz) and above. Optimized devices are theoretically capapble of operation with a speed-power product of 2 pico joules (pJ), achieving a switching speed of 1 nanosecond (ns) at a power dissipation of 2 mW per gate. The temperature range from 2° to 650°K for the GaAs junction field effect transistors (JFETS) encompasses applications which are not possible with silicon devices.

In addition, completed radiation testing revealed that GaAs JFETS and integrated circuits recover very rapidly from ionizing radiation pulses, undergo small degradations due to high neutron fluences and are immune to high total gamma doses, and therefore can be used in hardened electronic systems which are required to operate in nuclear environments too severe for silicon devices.

It may be noted that the general configuration of the enhancement mode or normally-off junction field effect transistor of this invention is somewhat similar to that of the single gate field effect transistor disclosed in the patent application of Rainer Zuleeg, Ser. No. 811,154 filed Mar. 27, 1969 for Multichannel Field-Effect Transistor and Process. The enhancement mode JFET, however, is physically different and involves specific critical parameters distinguishing the device from the prior single gate FET. Thus, the enhancement mode JFET is of an unobvious design having characteristics not predictable by standard FET theory.

SUMMARY OF THE INVENTION

Briefly, and in general terms, our invention is preferably accomplished by providing an enhancement mode or normally-off type of GaAs junction field effect transistor which is of a special design with a very small channel height whereby the normally conducting channel between source and drain is entirely depleted by the built-in junction voltage ($V_B$) of the diffused gate diode at a gate-to-source voltage ($V_{GS}$) of zero volts. The device is, therefore, normally-off and, as the junction is forward biased, the depletion region is reduced in height and the channel starts to conduct.

Low-power digital circuits are difficult to design with FET depletion devices because of the necessary level shifting between stages. However, GaAs enhancement mode FETs, possessing operating characteristics similar to low-threshold N-channel metal oxide semiconductor field effect transistors (MOSFETs), allow corresponding power-saving circuit configurations. The only significant difference between MOSFETs and GaAs enhancement FETs is the presence of gate current in the latter when the gate is forward biased. Illustrative circuits are disclosed of (1) a three-input, source-coupled logic, NOR/NAND gate including enhancement mode GaAs JFETS, (2) a three-input, quasi-complementary logic, NOR/NAND gate using enhancement mode GaAs JFETS, and (3) an integrated version of the quasi-complementary logic NOR/NAND gate.

BRIEF DESCRIPTION OF THE DRAWINGS

Our invention will be more fully understood, and other advantages and features thereof will become apparent, from the following description of an exemplary embodiment of the invention and certain illustrative circuits thereof. This description is to be taken in conjunction with the accompanying drawings, in which.

DESCRIPTION OF THE PRESENT EMBODIMENT

In the following description and accompanying drawings of an exemplary embodiment and certain illustrative circuits of our invention, some specific values and types of materials are disclosed. It is to be understood, of course, that such values and types of materials are given as examples only and are not intended to limit the scope of this invention in any manner.

Figure 1:
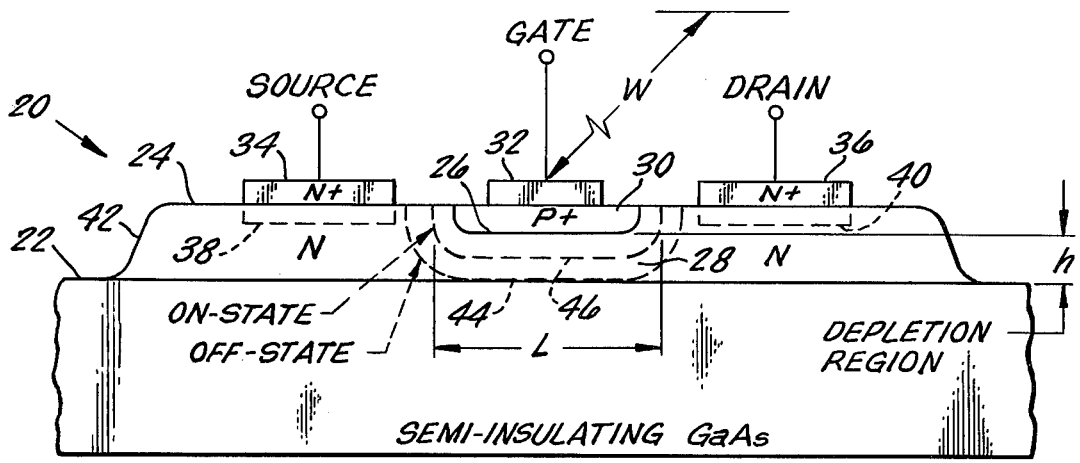
FIG. 1 is a fragmentary elevational view, somewhat diagrammatically shown, of an enhancement mode or normally-off junction field effect transistor constructed according to this invention.

FIG. 1 is a fragmentary elevational view, somewhat diagrammatically shown, of an enhancement mode or normally-off junction field effect transistor (JFET) 20 constructed according to this invention. The device 20 can be fabricated from vapor-phase epitaxial layers doped with tin (Sn) and grown on a semi-insulating substrate 22 of chromium-compensated gallium arsenide (GaAs). The N-type conductivity grown layer 24 can have a thickness of, for example, 0.5 to 0.8 micrometer (um). By diffusion of zinc (Zn) at 750° C in a closed ampoule system, a P+N junction 26 is formed. For the known doping level of the epitaxial layer 24, usually around $10^{17}$ cm$^{-3}$, the diffusion time is preferably selected to result in a channel 28 of height $h$ of approximately 0.1 um or 1000 angstroms (A). Alternatively, the P+N junction 26 can be formed by ion implantation.

Thickness of the substrate 22 can be in the range of 200 to 300 um. Channel length L is 4 um, and channel width W is 300 um for a "large" geometry device and is 150 um for a "small" geometry device, for example. Length and width of the epitaxial layer 24 of a large-geometry device 20 can be 125 and 300 um, respectively.

The P+N junction 26 in FIG. 1 establishes a gate region 30 having an ohmic contact 32 which can be of gold (Au) sputtered onto the surface of the gate region. Ohmic contacts 34 and 36 to source and drain regions 38 and 40, respectively, can be made of gold-germanium (Au-Ge) alloy with gold overlay. Of course, source and drain can be interchangeably used as such in the device 20. Isolation of a device 20 is accomplished by etching of the N-type layer 24 to form a mesa 42. Interconnection of a plurality of the devices 20 to form complex integrated circuits on a chip can be made by gold stripes (not shown) traversing over the semi-insulating substrate 22 between the devices.

In comparison to a standard normally-on junction field effect transistor (JFET) or metal semiconductor field effect transistor (MESFET), the enhancement mode or normally-off JFET 20 has a threshold voltage $V_T$ for conduction current to start. This threshold voltage $$V_T = V_B - V_P \tag{Eq. 1}$$

where $V_B$ is the built-in junction voltage given by $$V_B = (kT/q) \ln (N_A N_D / n_i^2) \tag{Eq. 2}$$

and $V_P$ is the theoretical pinch-off voltage or voltage needed to deplete the channel 28 of height $h$ and is given by $$V_P = q N_D h^2 / 2 e e_o \tag{Eq. 3}$$

In Equations 2 and 3, $kT/q$ is about 25 millivolts (mV) at ordinary room temperature, and $N_A$ and $N_D$ are respectively the impurity concentrations of acceptors and donors of the P and N sides of the P+N junction 26. Thus, $N_D$ is the channel doping. $n_i$ is the intrinsic carrier concentration of the semiconductor and which is about $1.1 \times 10^7$ cm$^{-3}$ for GaAs at room temperature. $q$ is the electron charge and $ee_o$ is the absolute dielectric constant of the semiconductor material.

The channel conditions for an applied gate voltage $V_G$ less than $V_T$ and greater than $V_T$ are respectively indicated by the broken lines 44 and 46. The channel 28 remains pinched off as long as $V_G$ is less than $V_T$ and no current will flow in the channel. For $V_G$ greater than $V_T$, the depletion region will be narrower than the physical channel height h and a conducting channel is formed in the N-type material. Thus, a drain current will flow in the device 20 when a transverse voltage is applied. This current is controlled by the change of $V_G$. The device 20 obeys a square-law characteristic.

A minimum threshold voltage $V_T$ of zero is defined when $$V_B = V_P \tag{Eq. 4}$$

In most practical applications, however, $V_T$ is in the range of 0.1 to 0.5 volt (V). The forward and positive bias voltage $V_G$ is restricted to voltages below 1 volt since no large minority carrier injection in the channel region is desirable for field effect transistor (FET) operation. The condition of Equation 4 gives then a minimum product of $N_D h^2$ from the relationship $$V_B = (N_D h^2) q / 2 e e_o \tag{Eq. 5}$$

to assure the operation of a JFET or MESFET in the enhancement mode.

A standard JFET or MESFET operates with an electrically conducting channel when no gate bias is applied. This is then a normally-on, current carrying, device which is a depletion mode FET. Applying a negative gate voltage depletes the channel region of mobile carriers. Thus, the channel region narrows and finally becomes nonconducting when completely pinched off at a negative gate voltage $$V_{GP} = V_P - V_B \tag{Eq. 6}$$

Comparing Equation 6 with equation 1, it is apparent that enhancement mode operation has the opposite sign of gate voltage than depletion mode operation. The critical parameter to distinguish the two modes of operation is the threshold voltage which requires a specific value of $N_D h^2$ for a given $V_B$. For the present design of device 20, $h = 1000$ A $= 10^{-5}$ cm and $N_D = 1 \times 10^{17}$ cm$^{-3}$ so that $V_B \geq 0.8$ volt (V).

Figure 2:
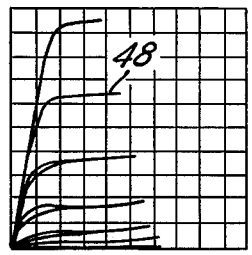
FIG. 2 is a graph showing a family of current-voltage characteristics of the enhancement mode junction field effect transistor.

FIG. 2 is a graph showing a family of current-voltage characteristics 48 at positive gate voltages of 0 to 1.2 V in 0.2 V steps. Typically, at $V_{GS} = 0$, $I_D$ is less than 10 microamperes (uA) and gate current $I_G$ is less than 10 nanoamperes (na). At $V_{GS} = +1$ V, $I_G$ is typically 20 uA and $I_D$ is 2 mA. Above $V_{GS} = +1$ V, $I_G$ rises rapidly and the typical ratio $I_D/I_G$ of 100 drops sharply. For example, at $V_{GS} = +1.2$ V, this ratio is better than 10:1 and, as the gate is forward biased further, the ratio reduces eventually to 1. This limits the possible fan-out in digital applications. The useful operating range for input gate voltages is then 0 to 1.2 V for nonlinear aplications and approximately 0.4 to 1.0 V for linear applications.

In digital applications, the optimum voltage level for logic "1" is approximately +1 V while the most desirable logic "0" level would be 0.V. When using one supply voltage, the logic 0 level is defined by the drain-to-source voltage $V_{DS}$ of the output device in the "on" condition. For a typical device, the drain-to-source or on resistance $R_{on}$ is 200 ohms. The resulting $V_{DS}$ at $I_D = 1$ mA is then 0.2 V which is acceptable since, at $V_{GS} = 0.2$ V, $I_D$ is still under 1 uA for the typical device.

Figure 3:
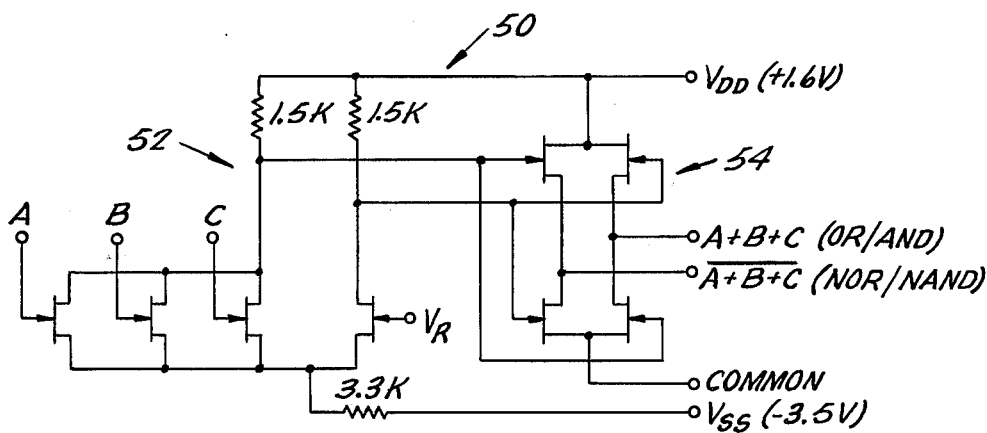
FIG. 3 is a circuit diagram of a three-input, source-coupled logic, NOR/NAND gate including enhancement mode GaAs junction field effect transistors.

FIG. 3 is a circuit diagram of an illustrative three-input, source-coupled logic, NOR/NAND gate 50. The gate 50 comprises gate portion 52 and buffer portion 54. The gate portion 52 includes four of the enhancement mode GaAs junction field effect transistors 20 connected as shown and, similarly, the buffer portion 54 also includes another four of such enhancement mode GaAs JFETs. Not considering the dissipation in its external load (not shown), the average power dissipation $P_{D(av)}$ of the gate 50 is 3.2 mW and its speed-power product is 21.6 pJ, for example.

Figure 4:
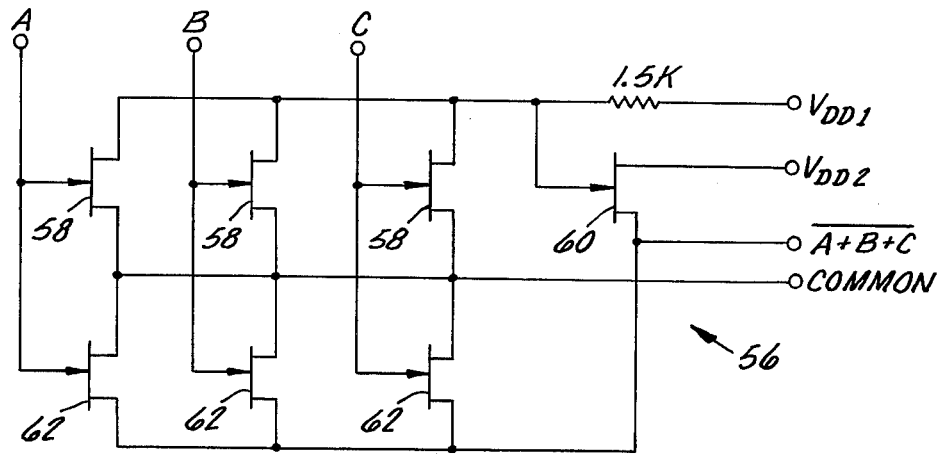
FIG. 4 is a circuit diagram of a three-input, quasi-complementary logic, NOR/NAND gate using enhancement mode GaAs junction field effect transistors.

FIG. 4 is a circuit diagram of a three-input, quasi-complementary logic NOR/NAND gate 56. This gate 56 comprises three inverters 58 of a small geometry with a common load resistor followed by a large geometry source follower 60, and three large geometry inverters 62 directly connected with their common drain to the output. The three inverters 58 includes three of the enhancement mode GaAs junction field effect transistors 20 connected as shown, and the source follower 60 includes another enhancement mode GaAs JFET. This source follower 60 provides a fan-out capability of 5 for the logic 1 state. The three large-geometry inverters 62 provide adequate current sinking for the logic 0 state. The gate 56 does not provide complementary outputs; however, it has greater speed with decreased power dissipation which is reflected in a speed-power product of only 7.9 pJ, for example. Propagation delay time $t_{pd}$ for the gate 56 is 3 ns for the conditions indicated.

While the d-c sourcing or sinking capability could be adequately handled by small-geometry devices 20, the large-geometry devices are needed to provide the fast switching characteristics when driving capacitive loads. Gate area is $4 \times 300$ um$^2$ in the large-geometry devices 20 and $3 \times 150$ um$^2$ in the small-geometry ones, for example. It may be noted that by reducing the operating current, propagation delay and rise time increase but the resultant speed-power product is further reduced.

Figure 5:
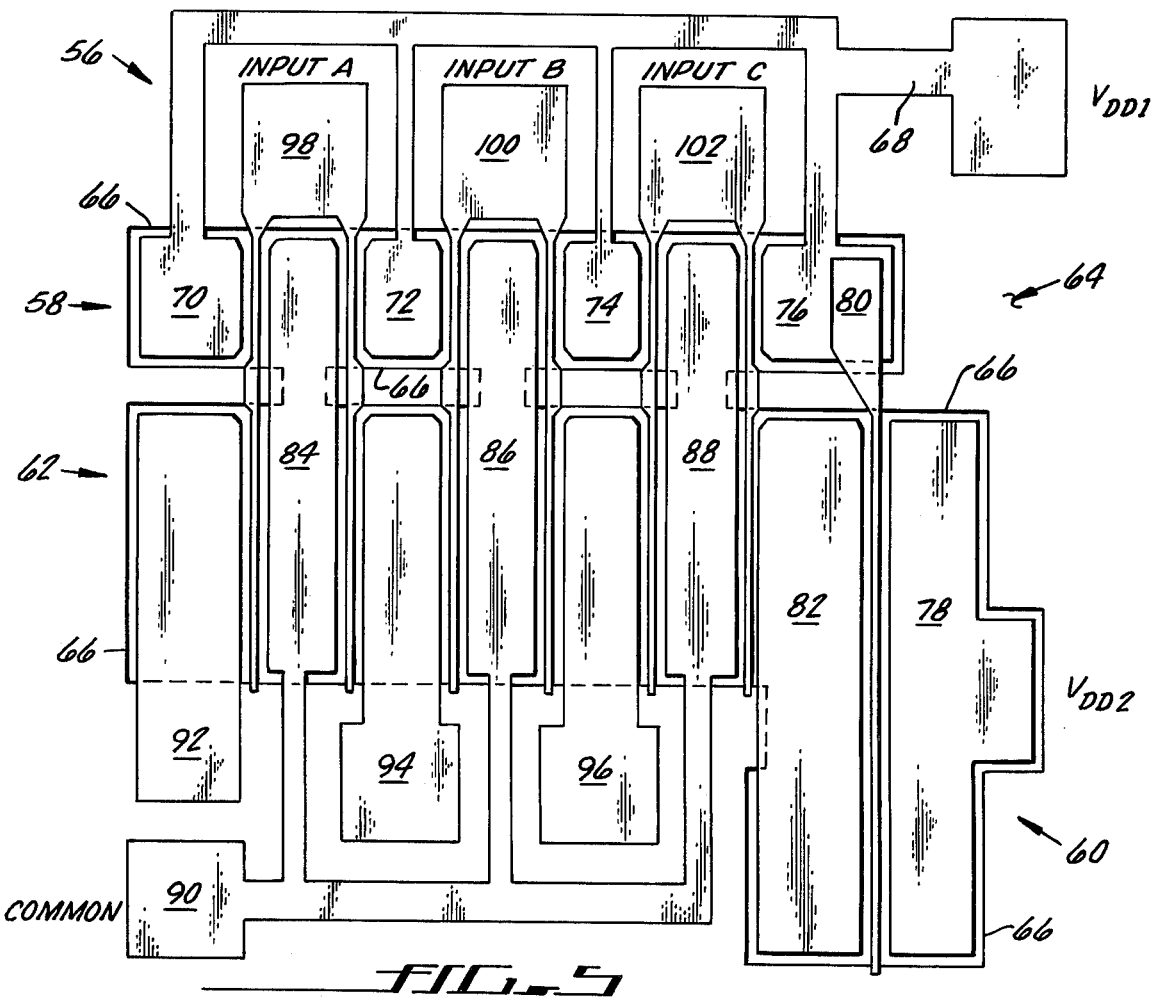
FIG. 5 is a plan view of an integrated version of the three-input, quasi-complementary logic, NOR/NAND gate shown in FIG. 4.

FIG. 5 is a plan view of an integrated version of the quasi-complementary three-input NOR/NAND gate 56 whose schematic circuit is shown in FIG. 4. The layout of the gate 56 was made with computer aided design and has a chip size of $30 \times 30$ mil$^2$, for example. Gate 56 includes a semi-insulating substrate 64 having a semiconducting epitaxial layer 66 thereon of the form or shape shown. Three small-geometry inverrters 58 are adjacently positioned in a row above three similarly arranged large-geometry inverters 62. A large-geometry source follower 60 is located at the lower right area, and a common load resistor 68 is located at the upper right area of the chip portion.

Drain contacts 70, 72, 74 and 76 are all connected to the left end of the common load resistor 68. The right end of the resistor 68 can be suitably connected to a drain voltage $V_{DD1}$. Source follower 60 includes drain, gate and source contacts 78, 80 and 82. The follower drain contact 78 can be connected to a second drain voltage $V_{DD2}$, and the gate contact 80 is joined with the drain contact 76. Source contacts 84, 86 and 88 are all connected to a common (ground) terminal 90. Drain contacts 92, 94 and 96 are connected with the follower source contact 82 by wiring (not shown) to the output terminal (shown in FIG. 4) for the gate 56. Finally, gate contacts 98, 100 and 102 for inputs A, B and C, respectively, each includes two parallel strip portions that contact the gate regions of the corresponding inverters 58 and 62.

It is noted that the two inverters 58 and 62 associated with input A, for example, have essentially one common source 84 but the drains 70 and 72 are respectively isolated from drains 92 and 94 by the form or shape of the epitaxial layer 66. It can also be seen that the drains 72 and 94 each serves two adjacent inverters. That is, drain 70, source 84 and drain 72 are part of the inverter 58 having the input A, and drain 72, source 86 and drain 74 are part of the adjacent inverter 58 having the input B. Similarly, drain 92, source 84 and drain 94 are part of the inverter 62 having the input A, and drain 94, source 86 and drain 96 are part of the adjacent inverter 62 having the input B. Source 82 of the follower 60 also functions as a drain with the source 88 of the inverter 62 having the input C. It is apparent that considerable real estate is saved with the design of FIG. 5.

While an exemplary embodiment and certain typical circuits of this invention have been described above and shown in the accompanying drawings, it is to be understood that such embodiment and circuits are merely illustrative of, and not restrictive on, the broad invention and that we do not wish to be limited in our invention to the specific arrangements, circuits and constructions described and shown, for various modifications may occur to persons having ordinary skill in the art.

We claim:
1. A nor/nand gate circuit comprising:
a plurality of first normally-off type of junction field effect transistors, each of said first transistors including a drain, gate and source;
a like plurality of second normally-off type of junction field effect transistors, each of said second transistors including a drain, gate and source;
a like plurality of individual input terminals;
a third normally-off type of junction field effect transistor, said third transistor including a drain, gate and source;
a common impedance means connecting said drains of said first transistors and said gate of said third transistor to a first supply voltage, said drain of said third transistor being connected to a second supply voltage, said drains of said second transistors and said source of said third transistor being connected to a first output terminal, said sources of said first and second transistors being connected directly to a second output terminal; and
means connecting said gates of said first transistors and said gates of said second transistors directly to each other by pairs and each such pair directly to a corresponding one of said input terminals in an arrangement of said first and said second transistors which is symmetrical relative to said second output terminal.

2. The invention as defined in claim 1 wherein said third transistor comprises a large-geometry device whereby a large fan-out capability is obtained for said gate means.

3. The invention as defined in claim 2 wherein said first transistors comprise a plurality of small-geometry devices and said second transistors comprise a plurality of large-geometry devices whereby fast switching characteristics are obtained for said gate means when driving a capacitive load means connected to said first and second output terminals.

4. The invention as defined in claim 1 wherein the transistors are formed on an intergrated circuit chip comprising a semi-insulating substrate having a selectively shaped epitaxial layer thereon, the first and second transistors being aligned with each other by pairs, each pair being adjacent a corresponding input gate connection, the sources of the first and second transistors being formed as common connections having individual portions extending along corresponding aligned pairs of the first and second transistors.

5. The invention as defined in claim 4 wherein each input gate connection straddles a corresponding common source connection to establish a shared relationship of the drains of an intermediate transistor pair to an adjacent transistor pair.

* * * * *